(12) United States Patent
Wu et al.

(10) Patent No.: US 7,189,627 B2
(45) Date of Patent: Mar. 13, 2007

(54) METHOD TO IMPROVE SRAM PERFORMANCE AND STABILITY

(75) Inventors: Zhiqiang Wu, Plano, TX (US); Shaofeng Yu, Plano, TX (US); C. Rinn Cleavelin, Lubbock, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/921,532

(22) Filed: Aug. 19, 2004

(65) Prior Publication Data

US 2006/0040462 A1 Feb. 23, 2006

(51) Int. Cl.
*H01L 21/76* (2006.01)

(52) U.S. Cl. ............... 438/424; 438/430; 257/E21.661

(58) Field of Classification Search .............. 438/142, 438/149, 151, 197, 217, 218, 221, 257, 424, 438/430, 433, 479; 257/E21.661
See application file for complete search history.

(56) References Cited

U.S. PATENT DOCUMENTS

| | | | |
|---|---|---|---|
| 5,672,536 A | 9/1997 | Wu et al. | |
| 5,937,283 A * | 8/1999 | Lee | 438/149 |
| 6,184,539 B1 | 2/2001 | Wu et al. | |
| 6,262,911 B1 * | 7/2001 | Braceras et al. | 365/154 |
| 6,313,011 B1 | 11/2001 | Nouri | |
| 6,369,994 B1 * | 4/2002 | Voldman | 361/56 |
| 6,404,018 B1 | 6/2002 | Wu et al. | |
| 6,414,359 B1 | 7/2002 | Madan | |
| 6,420,226 B1 * | 7/2002 | Chen et al. | 438/238 |
| 6,507,124 B2 | 1/2003 | Kumagai et al. | |
| 6,534,805 B1 | 3/2003 | Jin | |
| 6,573,549 B1 | 6/2003 | Deng et al. | |
| 6,667,224 B1 | 12/2003 | Watt et al. | |
| 6,686,624 B2 * | 2/2004 | Hsu | 257/315 |
| 6,687,145 B2 | 2/2004 | Houston | |
| 6,713,333 B2 * | 3/2004 | Mayuzumi | 438/197 |
| 6,841,821 B2 * | 1/2005 | Hsu | 257/305 |
| 2003/0043677 A1 * | 3/2003 | Marr | 365/226 |
| 2005/0074935 A1 * | 4/2005 | Hsu | 438/200 |
| 2005/0127428 A1 * | 6/2005 | Mokhlesi et al. | 257/315 |

OTHER PUBLICATIONS

Stanley Wolf and Richard N. Tauber, Silicon Processing For The VLSI Era, 2000, Lattice Press, Second Edition, pp. 830-831.*

* cited by examiner

*Primary Examiner*—Walter Lindsay, Jr.
*Assistant Examiner*—Stanetta Isaac
(74) *Attorney, Agent, or Firm*—Rose Alyssa Keagy; W. James Brady; Frederick J. Telecky, Jr.

(57) ABSTRACT

A technique is disclosed for increasing the width of a transistor (300) while the transistor itself may be scaled down. The transistor width (382) is increased by forming recesses (352) within shallow trench isolation (STI) regions (328) adjacent to the transistor (300). The recesses (352) provide an area that wraps around the transistor and thereby increases the width (382) of the transistor (300). This wraparound area provides additional space for dopant atom deposition, which facilitates a reduction in random dopant fluctuation (RDF). In this manner, transistors formed in accordance with one or more aspects of the present invention, may yield improved performance when incorporated into SRAM since the probability that such transistors will be more closely matched is increased.

21 Claims, 8 Drawing Sheets

METHOD TO IMPROVE SRAM PERFORMANCE AND STABILITY

FIELD OF INVENTION

The present invention relates generally to semiconductor processing, and more particularly to fabricating a transistor in a manner that increases active width to mitigate random dopant fluctuation (RDF) and thereby facilitate improved performance and stability, particularly when utilized in static random access memory (SRAM).

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of many steps, during which hundreds or thousands of copies of an integrated circuit can be formed on a single wafer. This process can create electrically active regions in and on the semiconductor wafer surface. In MOS transistors, for example, a gate structure containing conductive material(s) is created, that can be energized to establish an electric field within a semiconductor channel, by which current is enabled to flow through the channel defined under the gate structure and between a source and drain region within the transistor. The source and drain regions and/or an upper portion of the gate structure facilitate this conductance by virtue of containing a majority of positively charged (P) or negatively charged (N) dopant materials. Adjusting the voltage applied to the gate changes the amount of current flowing through the channel. A gate electrode of the gate structure is separated from the channel by a gate dielectric, which is an insulator and which opposes current flow between the gate electrode and channel, such that the device does not conduct current until a sufficient voltage (at least as large as a threshold voltage $V_t$) is applied to the gate electrode.

Issues may persist with shrinking semiconductor devices. For example, random dopant fluctuation, and associated disadvantageous effects resulting therefrom, may become more prevalent as transistor widths and lengths are reduced. In general, random dopant fluctuation refers to differences in the amount of dopant atoms received within certain areas (e.g., source/drain regions and/or upper portion of gate structure) as those areas are reduced in size. For example, even the most uniform application of dopant atoms may produce a difference of a few atoms within targeted areas where the respective sizes of those areas are so small that they can only be expected to accommodate about one hundred or fewer dopant atoms. In such small areas, a difference of just a few dopant atoms can cause the areas to have different electrical properties. This can, for example, cause respective transistors which are formed from one or more of these areas to have different operating characteristics. For example, a plurality of transistors that are supposed to be 'matched' may trigger on or off at different threshold voltages (Vt). It can be appreciated that the effects of RDF may be even more noticeable in certain types of semiconductor devices, such as static random access memory (SRAM), for example, which incorporate multiple transistors.

Semiconductor memories can, for example, be characterized as volatile random access memories (RAMS) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed. DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Thus, SRAMs are generally more reliable and operate faster than DRAMs. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback in the form of cross-coupled inverters to store a bit of information, and the cells are often arranged in rows so that blocks of data such as words or bytes can be written or read simultaneously. Standard SRAM memory cells have many variations. The basic CMOS SRAM cell generally includes two N-type (NMOS) pull-down or drive transistors and two P-type (PMOS) load transistors in a cross-coupled inverter configuration, with two additional NMOS select transistors added to make up a six-transistor cell. Additionally, application specific SRAM cells can include an even greater number of transistors. Since a plurality of transistors are utilized in SRAM, and since random dopant fluctuations may become more prevalent as transistor widths are reduced, the adverse effects of random dopant fluctuations may present themselves to a great degree in SRAM, particularly as that type of memory is continually scaled down.

Accordingly, it would be desirable to have a technique that would allow transistors to be scaled down while mitigating RDF, particularly where the transistors may be used in SRAM.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to increasing the width of a transistor while the transistor itself may be scaled down in size. The transistor width is increased by forming recesses within shallow trench isolation (STI) regions adjacent to the transistor. The recesses provide a wraparound area that increases the width of the transistor and provides additional effective transistor area wherein more dopant atoms can be deposited. This increased dopant area facilitates a reduction in random dopant fluctuation (RDF). In this manner transistors formed in accordance with one or more aspects of the present invention may yield improved performance when incorporated into SRAM since the probability is increased that such transistors will be more closely matched.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 21 is a cross-sectional view illustrating conventional (STI) regions formed within a substrate where portions of a conventional transistor are depicted there-between.

DETAILED DESCRIPTION OF THE INVENTION

Figure 1:
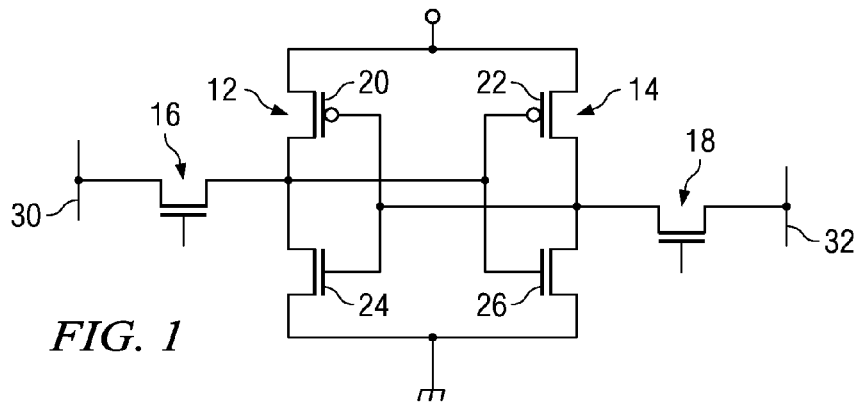
FIG. 1 is a schematic diagram of a conventional static random access memory (SRAM) cell.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to increasing the width of a transistor by over etching shallow trench isolation (STI) structures. For a given layout footprint, the over etched STI structures provide additional area for dopant atoms to enter into and thereby mitigate random dopant fluctuation (RDF). Transistors fabricated in accordance with one or more aspects of the present invention thus yield more stability when incorporated into SRAM or other circuits due to the increased likelihood that the transistors will be more closely matched.

FIG. 1 is a schematic diagram of a typical static random access memory (SRAM) cell. As illustrated, the SRAM cell generally comprises a pair of cross-coupled inverters 12, 14 to store a data bit state and a pair of pass transistors 16, 18 to read and write a data bit between the cross-coupled inverters 12, 14 and bitlines 30, 32. Respective inverters 12, 14 comprise a P-type MOS (PMOS) pull-up or load transistor 20, 22 and an N-type (NMOS) pull-down transistor 24, 26. Transistors 16, 18 are generally N-type as well. This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective PMOS (20, 22) and NMOS (16, 18, 24, 26) transistors are matched for the two inverters (12, 14). However, as dimensions are reduced to scale down devices, random dopant fluctuation can become an issue that adversely affects transistor matching. For example, certain areas of a transistor such as source/drain regions and an upper portion of a gate are doped with positively charged (P) or negatively charged (N) materials to facilitate desired electrical performance (e.g., current conduction within a channel region when a sufficient voltage (Vt) is applied to the gate, where the channel is situated under the gate and between the source and drain regions). As dimensions are reduced, however, the total number of dopant atoms that can be applied to smaller areas is similarly reduced (e.g., down to one hundred or fewer dopant atoms). For example, as transistor widths are reduced, gate, source and/or drain regions may only be able to accommodate a few dopant atoms (where transistor width can be said to run perpendicular to channel length, and where channel length in turn corresponds generally to a distance between the source and drain regions). A variation of just a few dopant atoms may thus correlate to a substantial percentage difference in a concentration of dopant atoms. For example, an area (or more precisely a volume) in one transistor may be doped to 100% (e.g., $10^{18}/cm^3$) while a corresponding volume in another transistor may only be doped to 80% due to a difference of only a few dopant atoms. A 20% difference in dopant concentration can lead to substantially different performance among the transistors, however.

A difference in dopant concentration due to RDF can, for example, give rise to limited drive current. When the drive current gets limited, the speed at which a memory cell can be accessed may be reduced, for example, and the time it takes to write to the cell may also be somewhat increased. Similarly, RDF from reduced transistor widths can also lead to variations in threshold voltage (Vt). And, as previously mentioned, SRAM that incorporates 'mis-matched' transistors can be adversely affected by operating characteristics that vary from transistor to transistor. For example, such SRAM may be unstable and store the wrong bit state (e.g., a logic 1 instead of a logic 0 or vice versa).

Figure 2:
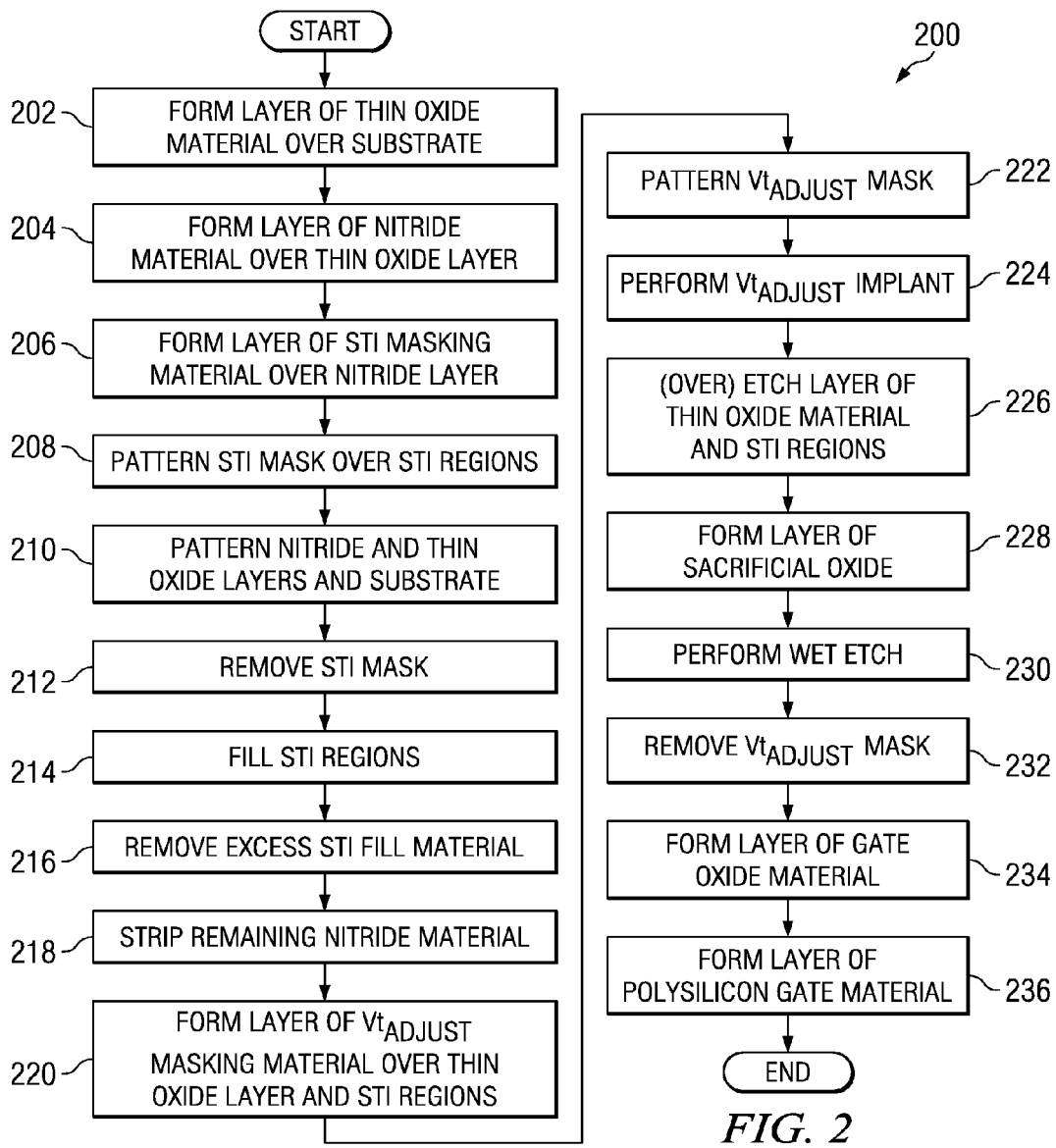
FIGS. 2 is a flow diagram illustrating an exemplary methodology for forming shallow trench isolation (STI) regions within a substrate where a transistor having an increased width can be formed there-between according to one or more aspects of the present invention.

Accordingly, turning to FIGS. 2A and 2B, a methodology 200 is illustrated and hereinafter described for forming a transistor in a manner that allows the transistor to be scaled down while mitigating random dopant fluctuation (RDF). A transistor formed in accordance with one or more aspects of the present invention that is utilized in a static random access memory (SRAM) facilitates stability, among other things, within the SRAM. While the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is with made within reference to SRAM, it is to be appreciated that one or more aspects of the present invention may have application to different types of memories and/or to other structures or circuits not illustrated or described herein.

At the outset, a layer of thin oxide material or pad oxide is formed over a substrate at 202. It will be appreciated that substrate or semiconductor substrate as used herein can include a base semiconductor wafer (e.g., silicon, SiGe, or an SOI wafer) and any epitaxial layers or other type semiconductor layers formed thereover or associated therewith. Additionally, the pad oxide layer may be formed using any appropriate oxidation processes as are known, such as a thermal oxidation growth or a deposition process. A layer of nitride material is then formed over the layer of oxide material at 204. The nitride layer may be formed using any appropriate deposition techniques and materials, such as $Si_3N_4$ deposited by low pressure chemical vapor deposition (LPCVD). The pad oxide layer may function to relieve stress between the underlying silicon substrate and the overlying nitride layer.

A layer of masking material is subsequently formed over the nitride layer at 206. The masking material will be patterned and utilized in forming non-conductive inactive regions, such as shallow trench isolation (STI) regions within the substrate. Such STI regions will separate or electrically isolate subsequently formed devices that are formed on and/or out of active regions of the semiconductor substrate. Accordingly, the STI masking material is patterned (e.g., via etching and/or a photolithographic process) over STI regions at 208, and is utilized as a guide at 210 in patterning (e.g., etching) the layer of nitride material, layer of thin oxide material, and substrate. Thereafter, the patterned STI mask is removed (e.g., stripped) at 212. It will be appreciated that an optional layer of liner oxide material can be grown and removed at this point to "round" corners of the substrate wherein STI cavities are defined. Such rounded corners may, for example, advantageously mitigate stresses in the substrate which can lead to carrier mobility degradation with corresponding worsening of performance parameters (e.g., drive current capability, increased threshold voltage, etc.) in subsequently formed transistors.

At 214, STI regions are formed within the substrate wherein a dielectric is deposited in the STI trenches and over the layer of thin oxide material and layer of nitride material, such as an oxide based material. Excess STI fill material is then removed at 216 (e.g., via a chemical mechanical polishing (CMP) process). Removal of excess STI fill material also generally results in removal of some of the underlying layer of nitride material, which serves as a CMP stop for the planarization process. The remainder of the layer of nitride material is then removed (e.g., stripped) at 218. After the nitride is removed, another layer of masking material is formed over the STI regions and the layer of thin oxide material at 220. This layer of masking material can, for example, be one that is utilized to perform a $Vt_{ADJUST}$ implant of dopant ions that adjusts a threshold voltage Vt of a transistor formed upon the substrate and out of the active regions situated between STI regions. As such, forming a transistor in accordance with one or more aspects of the present invention, does not require additional mask steps. The $Vt_{ADJUST}$ mask is then patterned at 222 (e.g., via etching and/or a photolithographic process), and $Vt_{ADJUST}$ dopant ions are implanted into the substrate at 224. It will be appreciated, however, that the mask need not be a $Vt_{ADJUST}$ type of mask and that such implants are generally optional in semiconductor fabrication.

With the $Vt_{ADJUST}$ mask still in place, the layer of thin oxide material is removed at 226 (e.g., via etching). This action also removes some of the STI fill material, and in accordance with one or more aspects of the present invention this activity is allowed to continue for a period of time such that a recess is developed within STI regions by way of 'over-etching'. It will be appreciated that the substance utilized to remove the oxide and STI fill materials, such as an etchant, is selective relative to silicon so that the substrate is not removed while the activity continues on to remove the STI fill material. Nevertheless, an upper or surface portion of the substrate may be slightly affected by the persistence of the removal process. For example, some pitting may appear within the surface of the substrate. Accordingly, at 228 a thin layer of sacrificial oxide material is formed (e.g., grown) over the surface of the substrate and STI regions, and then removed at 230 (e.g., via a wet etching). It will be appreciated that the oxide material reacts with or bonds to the surface of the substrate such that when the oxide is removed at 230 damaged surface portions of the substrate are removed as well.

At 232, remaining portions of the patterned $Vt_{ADJUST}$ mask are removed (e.g., chemically stripped). A thin layer of gate dielectric material is then formed (e.g., grown) over the substrate and STI regions at 234. The layer of gate dielectric material is substantially non-conductive and can be formed to a thickness of about 2.0 nanometers, for example. Also, the layer of gate dielectric material may include, for example, a high-k dielectric material and/or any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

A layer of gate electrode material is similarly formed over the layer of gate dielectric material at 236. The layer of gate electrode material is electrically conductive and can be formed to a thickness of about 200 nanometers or less, for example. Also, the layer of gate electrode material may include polysilicon, SiGe or metal, for example. The methodology can then proceed on for further back end processing where the layer of gate electrode material and the layer of gate dielectric material can be patterned (e.g., via etching) to form a transistor gate structure between inactive STI regions of the substrate. In this manner, a conductive gate electrode is separated from an active region of the substrate by a non-conductive gate dielectric. In subsequent processing, source and/or drain regions may be established within the active region of the substrate by selectively doping regions of the substrate adjacent to the gate structure. By way of example, a dopant of Arsenic or other suitable substance having a concentration of about 0.5 to 5E20 atoms/cm$^3$ may be implanted at an energy level of about 30 to 50 KeV to establish source/drain regions to a depth of about 200–2000 Angstroms, for example. Similarly, the conductivity of the gate electrode may be altered by adding dopant ions thereto as well. The source/drain regions are effective to establish a connection to a channel within the substrate under the gate structure, and a current may be developed within the channel when a sufficient voltage is applied to the transistor (e.g., via the conductive gate electrode).

It will be appreciated that the 'over-etching' of the STI regions allows the width of a transistor formed therebetween to be increased. Essentially, the respective recesses formed within the STI regions provide additional surface area for the layers of gate dielectric and gate electrode materials to form above the substrate. This additional 'wraparound' area of the transistor allows an increased number of dopant atoms to enter certain regions of the transistor (e.g., channel, source and/or drain regions) even as the transistor is scaled down. The increased effective area for the dopant atoms serves to mitigate random dopant fluctuation (RDF) since more dopant atoms can be accommodated by these areas. As such, RDF is mitigated among corresponding areas of similarly fabricated transistors. Thus, SRAM or other circuitry incorporating such transistors may be more stable as the transistors are more likely to be balanced or matched.

Figure 3:
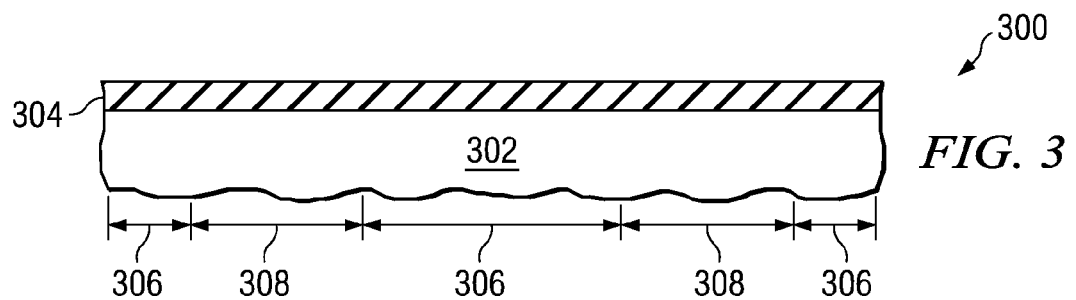
FIGS. 3–20 are cross-sectional views illustrating the formation of (STI) regions within a substrate where a transistor can be formed there-between so as to have an increased width according to one or more aspects of the present invention.
Figure 4:
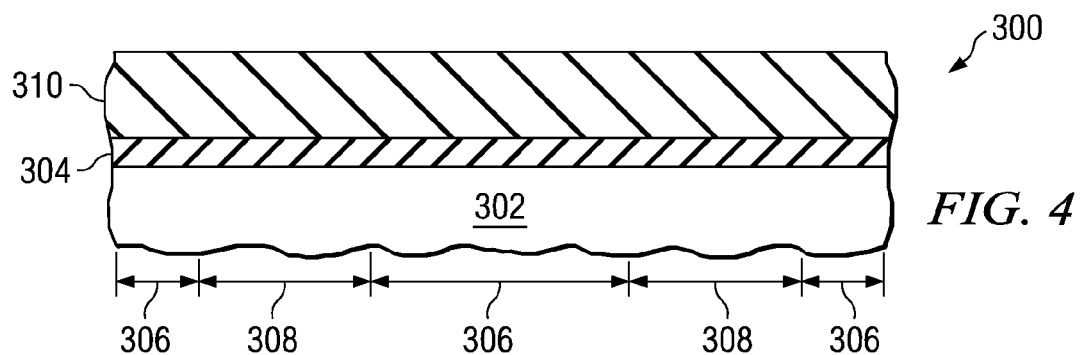
Figure 5:
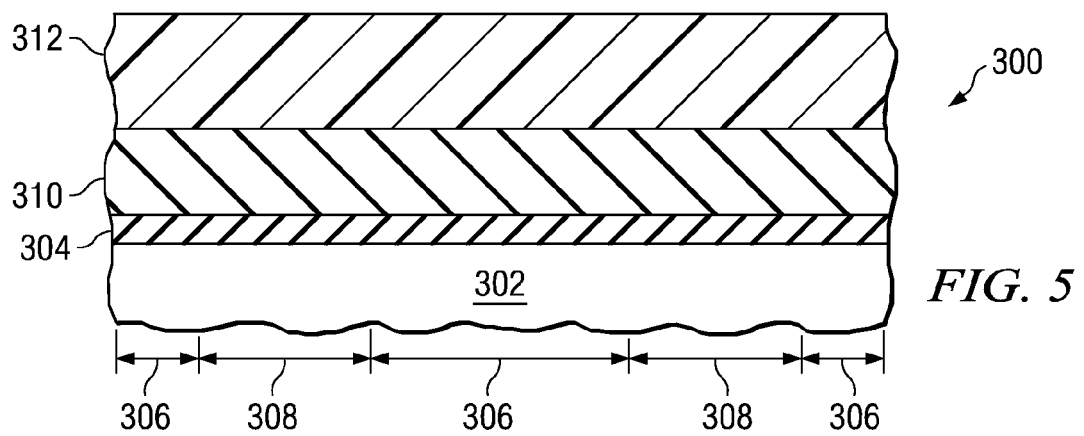

Turning now to FIGS. 3–21, an exemplary technique for forming a transistor 300 according to one or more aspects of the present invention is disclosed. Initially, a semiconductor substrate 302 has a layer of thin oxide material or a pad oxide 304 formed there-over (FIG. 3). It will be appreciated that the substrate generally includes silicon (e.g., the substrate, an epitaxial layer, or semiconductor body region overlying an insulator in an SOI wafer). Additionally, active regions 306 and inactive or isolation regions 308 are denoted on the wafer 302, where electrical devices, such as transistors, are to be fabricated on the active regions 306, and such devices are to be separated from one another by the inactive regions 308. A layer of nitride material 310 is then formed over the layer of oxide material 304 (FIG. 4). It will be appreciated that the pad oxide layer 304 may function to relieve stress between the underlying silicon substrate 302 and the overlying nitride layer 310 and/or serve other functions.

Figure 6:
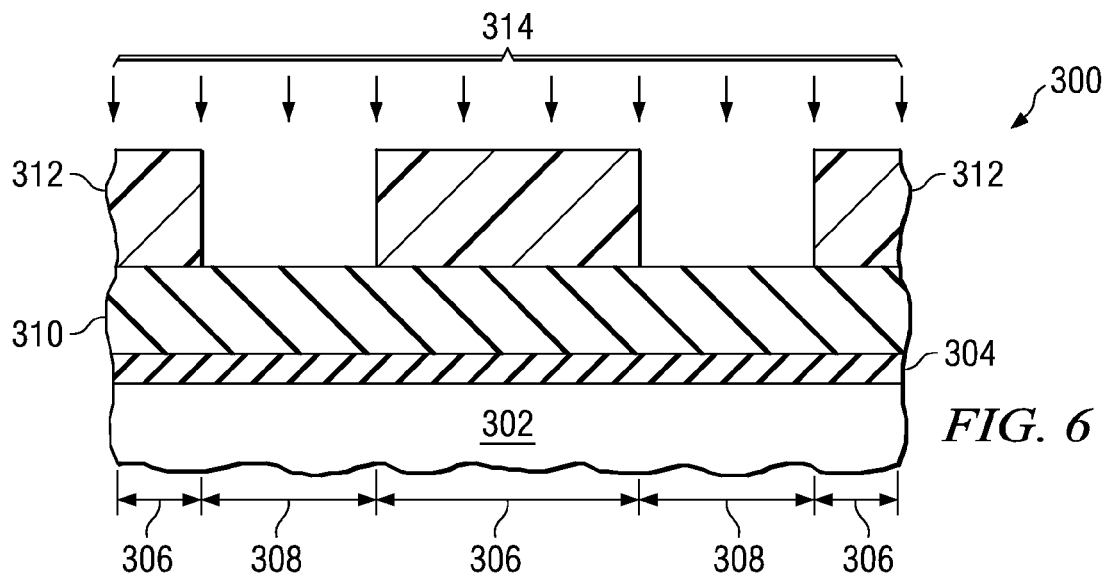
Figure 7:
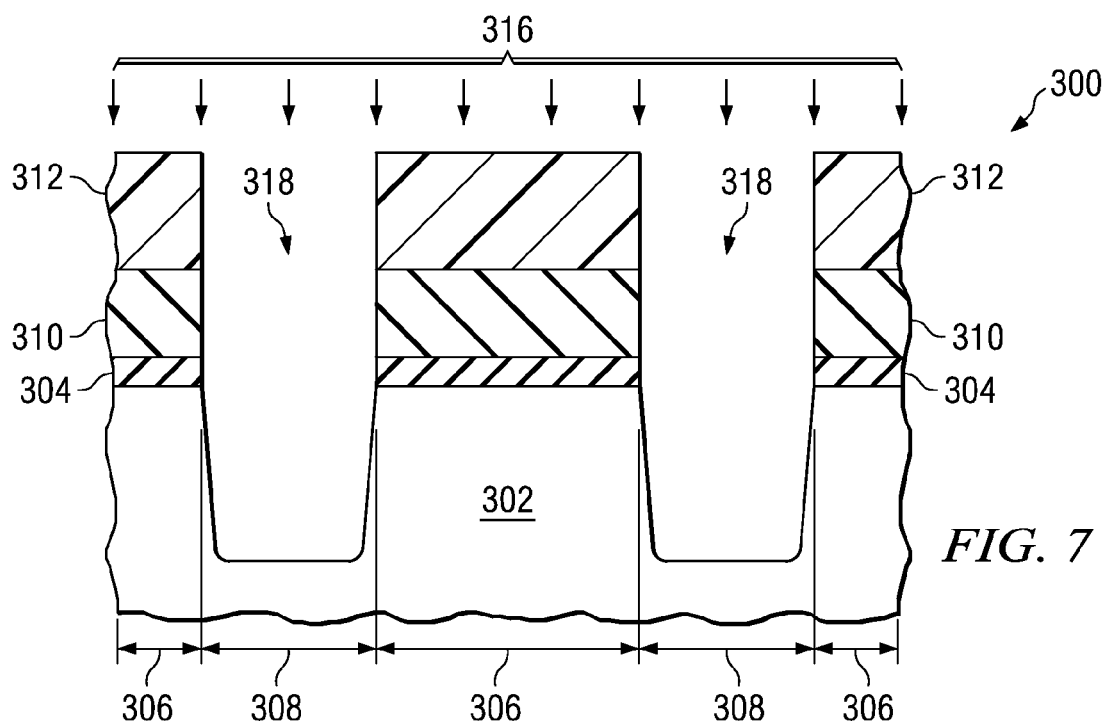
Figure 8:
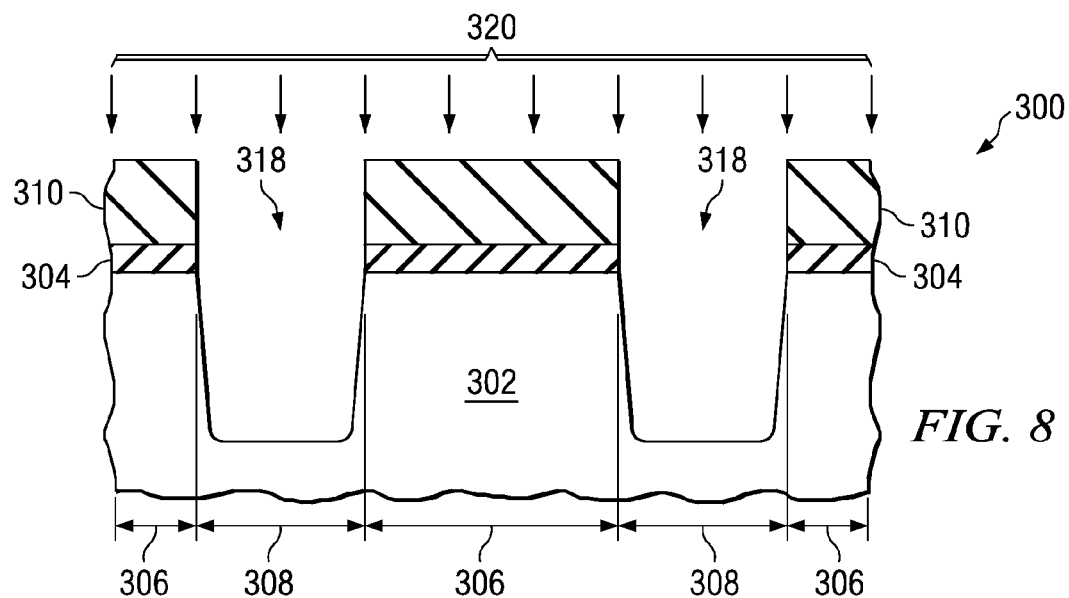

A layer of masking material 312 is formed over the layer of nitride material 310 (FIG. 5); the masking material 312 is patterned by an etching and/or a photolithographic process 314, for example (FIG. 6). The masking material 312 is patterned over the isolation regions 308, which correspond to shallow trench isolation (STI) regions in the illustrated example. The layer of nitride material 310, layer of thin oxide material 304 and substrate 302 are also patterned (e.g., via an etching process 316) to form STI cavities or trenches 318 over the isolation regions 308 with the patterned masking material 312 serving as a guide (FIG. 7). Thereafter, the patterned masking material 312 is removed, such as by a wet etching process or dry ashing process 320, for example (FIG. 8).

It will be appreciated that an optional layer of liner oxide material (not shown) can be grown and removed to "round" corners of the substrate 302 wherein the STI cavities or trenches 318 are defined. For example, a layer of sacrificial oxide material can be grown over the respective sidewalls and bottoms of the trenches using a thermal oxidation process which oxidizes substrate material from the sidewalls and bottoms faster than from lower corners of the trenches. As a result, when the sacrificial oxide is removed (e.g., via a wet etch process) the lower corners of the trenches 318 are rounded off, which can mitigate stresses and other problems associated with sharp lower corners, such as carrier mobility degradation and parasitic leakage currents between adjacent transistors, for example.

Figure 9:
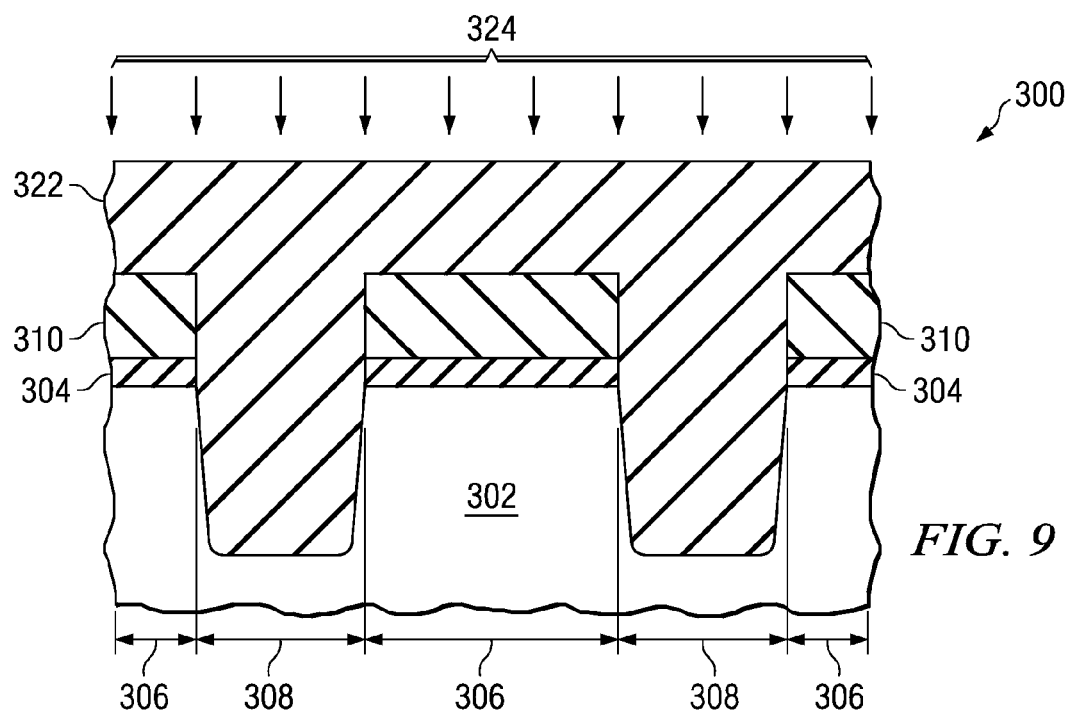
Figure 10:
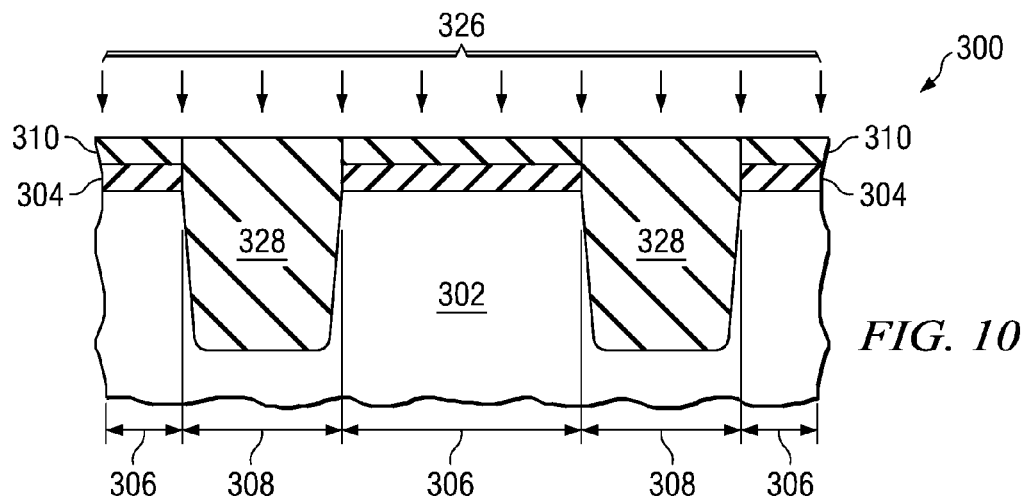
Figure 11:
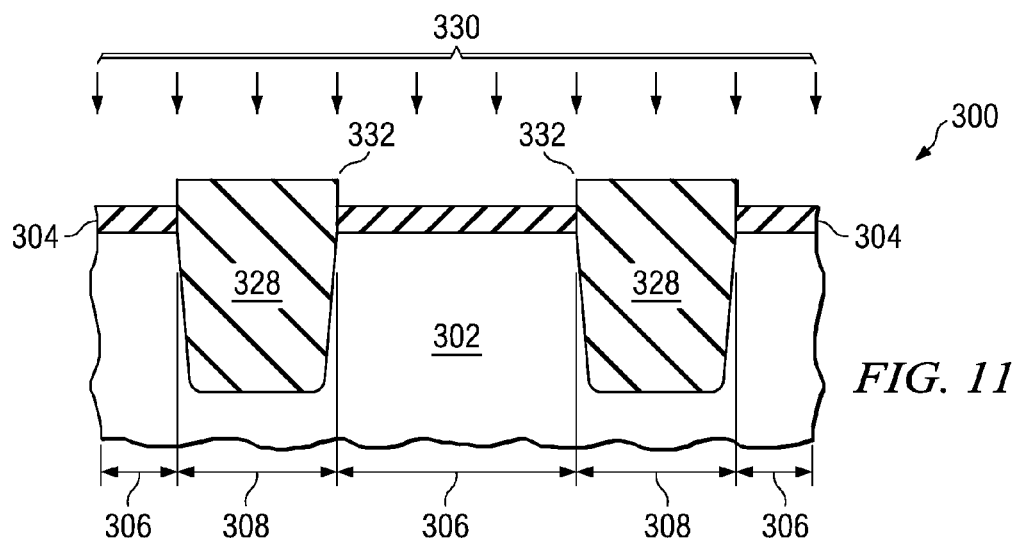

The STI cavity regions 318 formed within the substrate 302, layer of thin oxide material 304 and layer of nitride material 310 are filled with an insulating material 322, such as an oxide based material, by a deposition process 324, for example (FIG. 9). Excess STI fill material 322 is then removed, such as by a chemical mechanical polishing (CMP) process 326, for example, to leave STI structures 328 within the substrate 302 (FIG. 10). It can be seen that removal of excess STI fill material 322 also generally results in removal of some of the underlying layer of nitride material 310. The remainder of the layer of nitride material is then removed, such as by a wet or dry etch 330, for example (FIG. 11). This process 330 is generally selective to the fill material 322 such that STI structure protrusions 332 remain after the nitride material 310 is removed.

Figure 12:
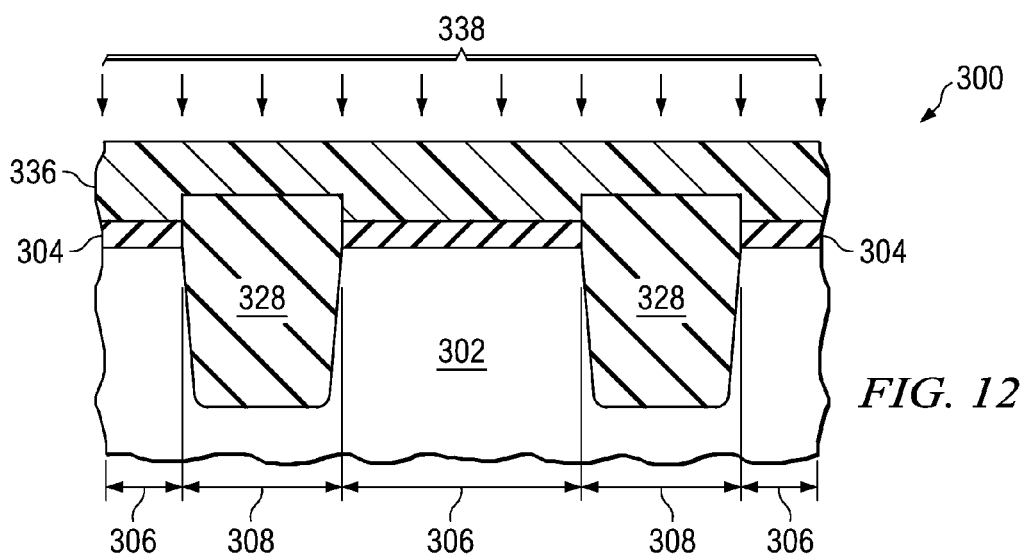
Figure 13:
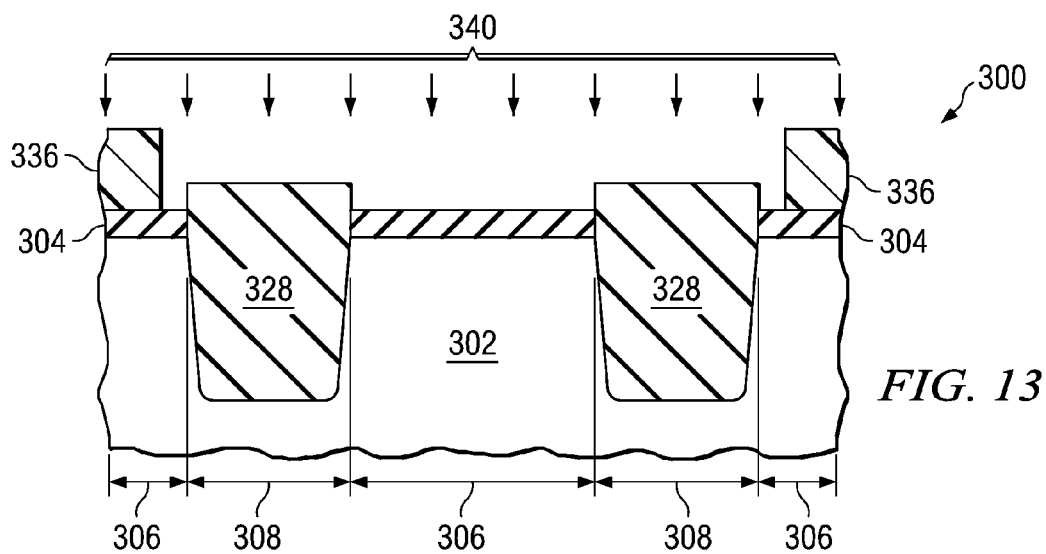
Figure 14:
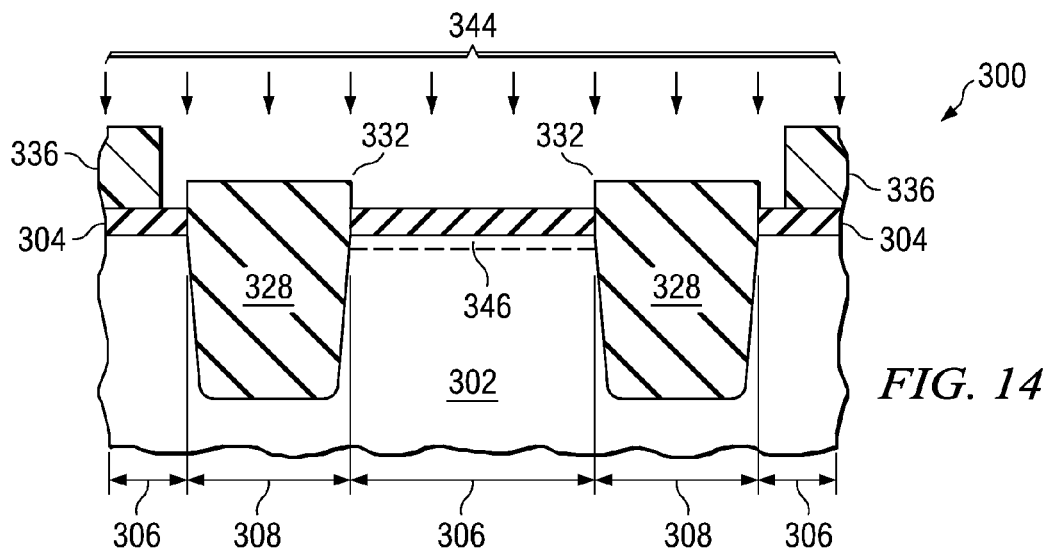

After the nitride material 310 is removed, another layer of masking material 336 is formed over the STI structures 328 and the layer of thin oxide material 304, such as by a deposition process 338, for example (FIG. 12). This layer of masking material 336 can, for example, be one that is utilized to perform a $Vt_{ADJUST}$ implant that implants dopant ions within the substrate 302 to adjust a threshold voltage Vt of a transistor formed upon the substrate 302. Accordingly, forming a transistor in accordance with one or more aspects of the present invention, does not necessitate additional acts or layerings. The masking material 336 is patterned, such as by an etching and/or a photolithographic process 340, for example (FIG. 13). Should the masking material 336 correspond to a $Vt_{ADJUST}$ mask, a doping process 344 implants dopant ions 346 into the substrate 302 (FIG. 14). It will be appreciated, however, that the mask 336 need not be a $Vt_{ADJUST}$ type of mask and that such $Vt_{ADJUST}$ implants are generally optional in semiconductor fabrication.

Figure 15:
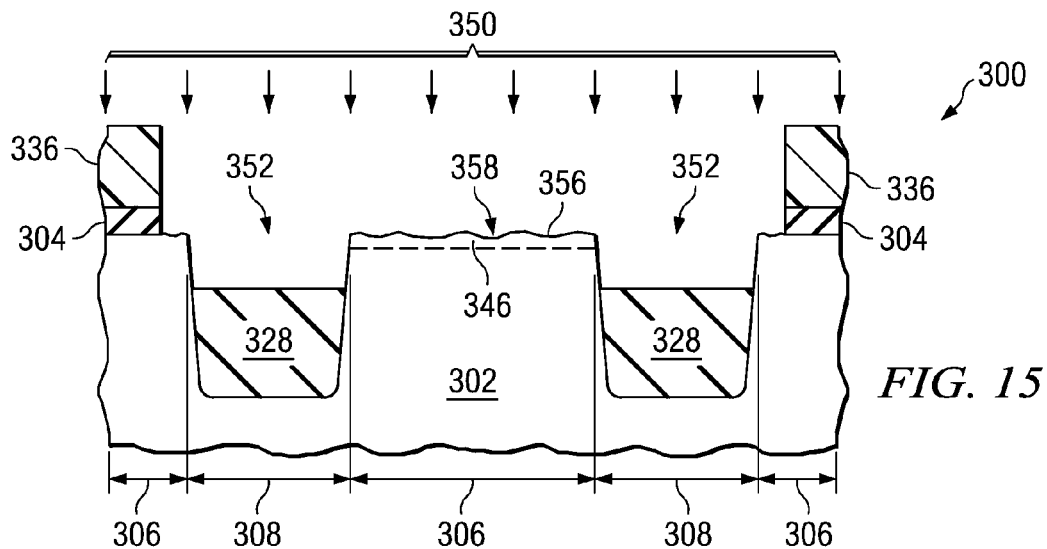
Figure 16:
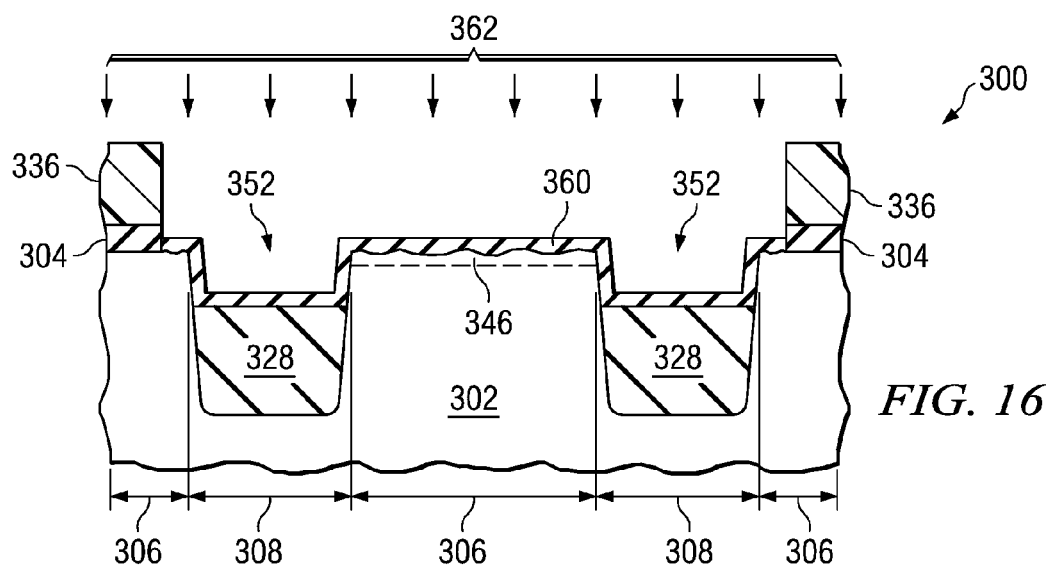
Figure 17:
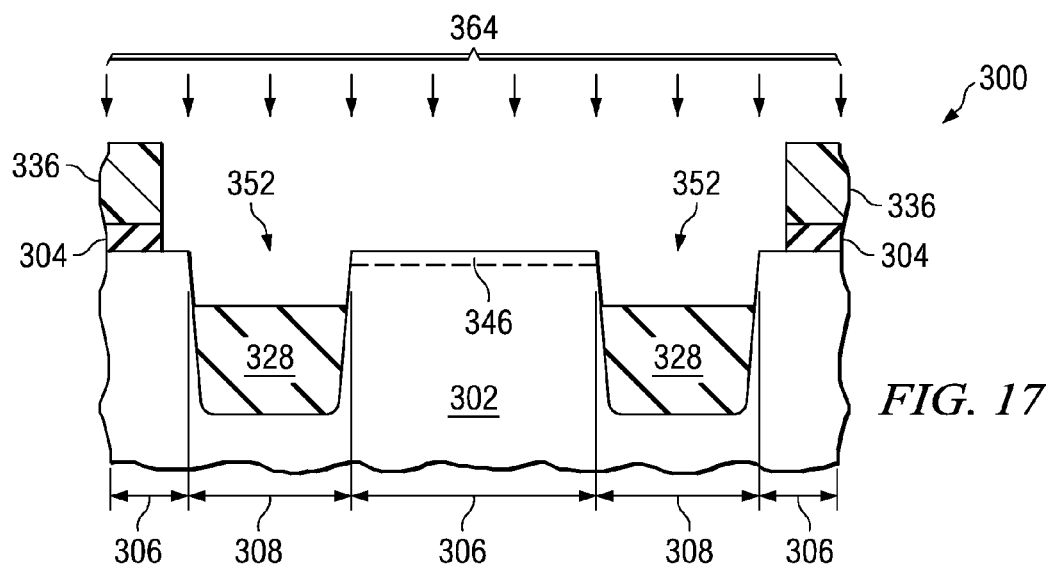

With the patterned mask 336 still in place, the layer of thin oxide material 304 is removed, such as by an etching process 350, for example (FIG. 15). This process also removes some of the STI structures 328 beginning with the protrusions 332. In accordance with one or more aspects of the present invention, this process is allowed to continue for a period of time such that the STI structures 328 are 'over-etched' and respective recesses 352 are developed within the structures 328. It will be appreciated that the substance (e.g., an etchant) utilized to remove the oxide 304 and STI fill 322 materials is selective relative to silicon so that the substrate 302 is not removed while the STI recesses 352 are formed. Nevertheless, an upper or surface portion 356 of the substrate 302 may be slightly affected by the persistence of the removal process 350. For example, some pitting 358 may appear within the surface 356 of the substrate 302. Accordingly, a thin layer of sacrificial oxide material 360 is formed over the surface 356 of the substrate 302 and STI structures 328 by a thermal growth process 362, for example (FIG. 16). The sacrificial oxide 360 is then removed, such as by a wet etching process 364, for example (FIG. 17). It will be appreciated that the oxide material 360 reacts with or bonds to the surface 356 of the substrate 302 such that when the oxide 360 is removed, damaged surface portions 358 of the substrate 302 are removed as well, thereby repairing substantially the silicon surface.

Figure 18:
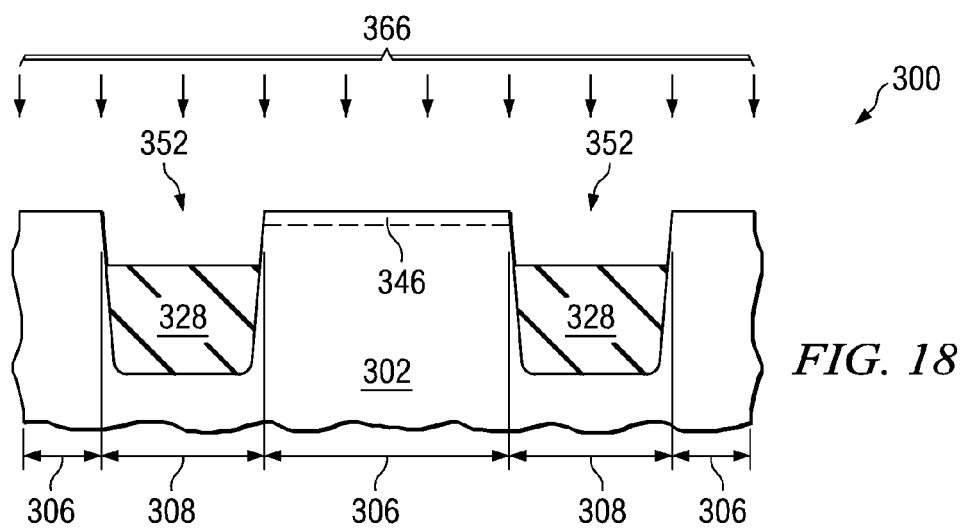
Figure 19:
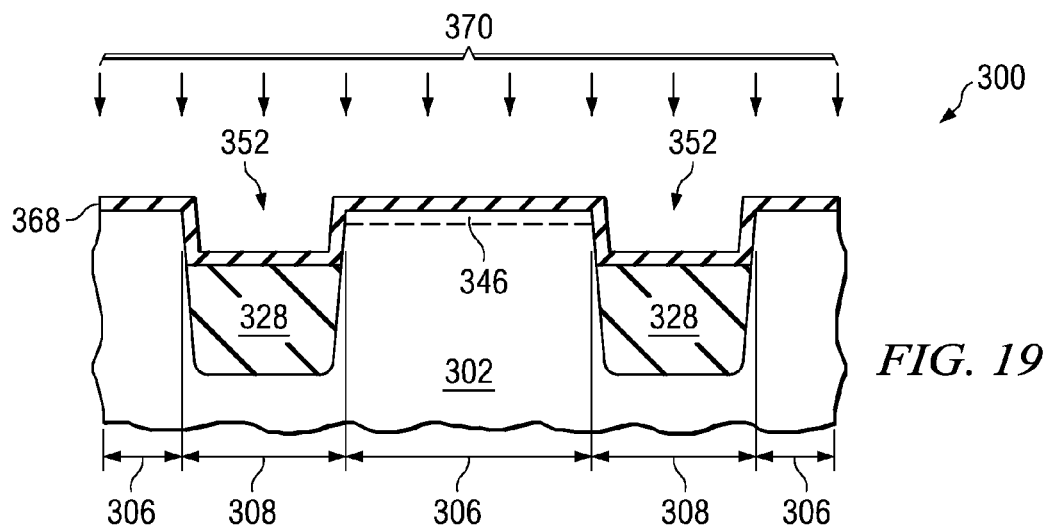

Remaining portions of the patterned masking material 336 are then removed, such as by a chemical stripping process 366, for example (FIG. 18). A thin layer of substantially non-conductive gate dielectric material 368 is then formed over the substrate 302 and STI structures 328, such as by a thermal growth process 370, for example (FIG. 19). It will be appreciated that a thickness of the thin layer of gate dielectric material 368 may vary over the substrate 302 and STI structures 328 depending upon process conditions. In one example, however, the layer of gate dielectric material is formed to a thickness of about 2.0 nanometers. Also, the layer of gate dielectric material 368 may include a high-k dielectric material and/or any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

Figure 20:
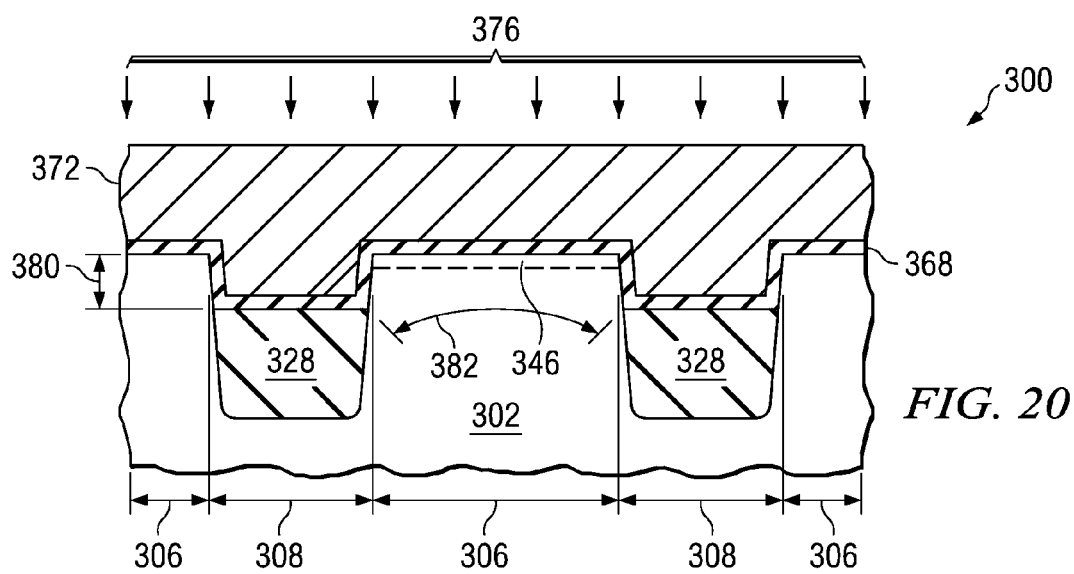
Figure 21:
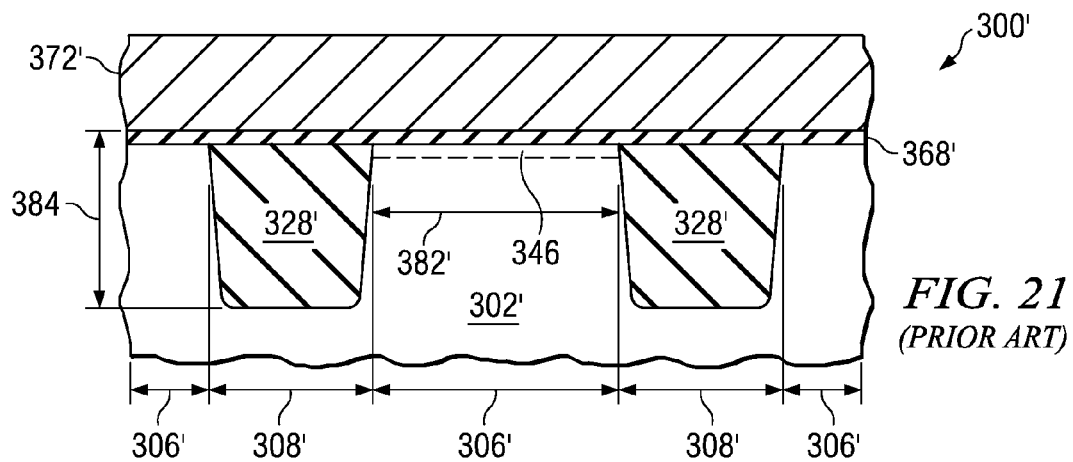

A layer of gate electrode material 372 is similarly formed over the layer of gate dielectric material 368, such as by a chemical vapor deposition process 376, for example (FIG. 20). The layer of gate electrode material 372 is electrically conductive and can be formed to a thickness of about 200 nanometers or less, for example. Also, the layer of gate electrode material 372 may include polysilicon, SiGe or metal, for example. The methodology can then proceed on for further back end processing where the layer of gate electrode material 372 and the layer of gate dielectric material 368 can be patterned (e.g., via etching) to form a transistor gate structure between inactive STI regions 308 of the substrate 302.

In this manner, a conductive gate electrode is situated above, but separated from an active region 306 of the substrate 302 by a non-conductive gate dielectric. In subsequent processing, source and/or drain regions may be established within the active region 306 of the substrate 302 by selectively doping regions of the substrate 302 adjacent to the gate structure. By way of example, a dopant of Arsenic or other suitable substance having a concentration of about 0.5 to 5E20 atoms/cm³ may be implanted at an energy level of about 30 to 50 KeV to establish source/drain regions to a depth of about 200–2000 Angstroms, for example. Similarly, the conductivity of the gate electrode may be altered by adding dopant ions thereto as well. The source/drain regions are effective to establish a connection to a channel within the substrate 302 under the gate structure, and a current may be developed within the channel when a sufficient voltage (Vt) is applied to the transistor (e.g., via the conductive gate electrode).

It will be appreciated that the recesses 352 formed within the STI structures 328 provide additional area (area that extends vertically into the substrate along side portions of the STI trenches) for dopant atoms to enter into, and thus facilitate mitigation of random dopant fluctuation (RDF), particularly in transistors that are fabricated in similar manners and that have corresponding areas which are doped (e.g., source, drain and/or gate regions). This additional area effectively 'wraps' around a device formed upon an active area 306 of the substrate 302. With regard to transistors, for example, this wraparound area effectively increases the width of the transistor by about 20–100 percent or more. Presently, this may correspond to an increase of between about 600 angstroms to about 1200 angstroms, for example. As illustrated in FIG. 20, for example, the STI recesses 352 formed according to one or more aspects of the present invention may be formed to a depth 380 of between about 400–500 angstroms. This increases the effective transistor width 382 to be between about 1600–1800 angstroms, for example. This is in contrast to conventional arrangements where the STI structures 328' have no recesses and are formed to a depth 384 of between about 2,000 to 5,000 angstroms (FIG. 21—where like elements are indicated with a prime "'" notation). In this situation, transistors 300' formed between such STI structures 328' have a width 382' on the order of only about 800 angstroms.

It will thus be appreciated that SRAM incorporating such transistors may be more stable as the transistors are more likely to be balanced or matched. Additionally, by making the transistor width larger the gate has more control relative to the channel and the drive current is increased which improves speed. Further, increased gate control mitigates undesirable aspects associated with short channel effects and also improves the subthreshold slope of an SRAM device, where subthreshold slope is a measure of short channel effects and resulting leakage currents. Subthreshold slope and is ascertained by plotting respective threshold voltage (Vt) values that cause transistors to turn off and on. Conventionally, subthreshold slope generally falls somewhere in-between about 80–90 milli-volts per decade, although more aggressively scaled devices can have a subthreshold slope above 90 milli-volts per decade.

However, by incorporating transistors formed in accordance with one or more aspects of the present invention that have the wraparound feature, subthreshold slope can be improved by at least 5–10 milli-volts per decade to between about 65 milli-volts per decade to about 75 milli-volts per decade, meaning that there is less leakage at the same threshold voltage (e.g., improvement on the order of between about 2 to 10 times lower leakage). It will also be appreciated that increasing transistor width in accordance with one or more aspects of the present invention may have more application to NMOS transistors, rather than PMOS transistors. This is particularly true where the transistors are incorporated into SRAM since the PMOS devices serve as load transistors within the SRAM, and thus have substantially lower drive current requirements.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. A method of forming shallow trench isolation (STI) regions so that a transistor formed there-between has an increased width, comprising:
    over etching the entire upper surface of STI structures formed within inactive regions of a substrate to establish respective STI recesses with the STI structures; and
    forming one or more layers of transistor building materials within the STI recesses and over an active region of the substrate, the active region of the substrate located between the STI structures, the one or more layers of transistor building materials comprising a layer of gate electrode material formed over a layer of gate dielectric material, and wherein forming the transistor building materials within the recesses increases the width of the transistor.

2. The method of claim 1, wherein the effective transistor width is increased by at least one of between about 20 percent to about 100 percent and between about 600 angstroms to about 1200 angstroms.

3. The method of claim 2, wherein SRAM incorporating the transistor has a sub threshold slope of between about 65 milli-volts per decade to about 75 milli-volts per decade.

4. The method of claim 1, wherein the transistor is at least one of an NMOS transistor and a PMOS transistor.

5. The method of claim 1, wherein the width of the transistor comprises a top surface of the active region and both sidewalls of the STI recesses that are adjacent to the top surface.

6. A method of forming at least some of a transistor between shallow trench isolation (STI) regions that are formed to allow the transistor to have an increased width, comprising:
    forming a layer of thin oxide material over a substrate;
    forming a layer of nitride material over the layer of oxide material;
    forming an first layer of masking material over the layer of nitride material;
    patterning the first layer of masking material over inactive regions within the substrate;
    patterning the substrate as well as the layer of oxide material and the layer of nitride material to form STI cavities with the patterned first layer of masking material serving as a guide;
    removing the patterned first layer of masking material;
    filling the STI cavities with an insulating material;
    removing excess STI insulating material to establish STI structures;
    forming a second layer of masking material over the STI structures and the layer of oxide material;
    patterning the second layer of masking material;
    removing the entire upper surface of some of the STI structures to establish respective STI recesses within the STI structures;
    removing the patterned second layer of masking material and the layer of oxide material; and
    forming one or more layers of transistor building materials within the STI recesses and over an active region of the substrate, the active region of the substrate located between the STI structures, the one or more layers of transistor building materials comprising a layer of gate electrode material formed over a layer of gate dielectric material, and wherein the transistor building materials formed within the recesses increases the width of the transistor.

7. The method of claim 6, wherein the effective transistor width is increased by at least one of between about 20 percent to about 100 percent and between about 600 angstroms to about 1200 angstroms.

8. The method of claim 6, wherein at least one of SRAM incorporating the transistor has a sub threshold slope of between about 65 milli-volts per decade to about 75 milli-volts per decade, the transistor is an NMOS transistor.

9. The method of claim 8 further comprising:
    patterning a gate structure out of the layer of gate electrode material and the layer of gate dielectric material.

10. The method of claim 6, wherein the width of the transistor comprises a top surface of the active region and both sidewalls of the STI recesses that are adjacent to the top surface.

11. A method of forming shallow trench isolation (STI) regions so that a transistor formed there-between has an increased effective width, comprising:
    forming a layer of thin oxide material over a substrate;
    forming a layer of nitride material over the layer of oxide material;
    forming an STI layer of masking material over the nitride layer;
    patterning the STI layer of masking material over inactive regions within the substrate;
    patterning the layer of nitride material, layer of thin oxide material, and substrate to form STI cavities with the patterned STI layer of masking material serving as a guide;
    removing the patterned STI layer of masking material;
    filling the STI cavities with an insulating material;
    removing excess STI insulating material and some of the layer of nitride material to establish STI structures;
    removing the remainder of the layer of nitride material;
    forming a layer of $Vt_{ADJUST}$ masking material over the STI structures and the layer of thin oxide material;
    patterning the layer of $Vt_{ADJUST}$ masking material;
    performing a $Vt_{ADJUST}$ implant;
    removing the layer of thin oxide material and some of the STI structures to establish respective STI recesses within the STI structures;

forming a thin layer of sacrificial oxide material over the surface of the substrate and STI structures;
removing the layer of sacrificial oxide material;
removing the patterned $Vt_{ADJUST}$ masking material;
forming a thin layer of gate dielectric material over the substrate and STI structures; and
forming a layer of gate electrode material over the layer of gate dielectric material, wherein forming the thin layer of gate dielectric material and the layer of gate electrode material results in the increased effective width.

12. The method of claim 11, further comprising:
patterning the layer of gate electrode material and the layer of gate dielectric material to form a transistor gate structure between the inactive STI regions within the substrate.

13. The method of claim 12, further comprising:
doping source and/or drain regions adjacent the gate structure.

14. The method of claim 13, further comprising:
utilizing a dopant of Arsenic.

15. The method of claim 13, further comprising:
utilizing a dopant a concentration of about 0.5 to 5E20 atoms/cm$^3$.

16. The method of claim 12, further comprising:
doping a gate electrode of the gate structure.

17. The method of claim 11, further comprising:
growing and removing a layer of sacrificial oxide material before the STI cavities are filled with the insulating material to round corners of the substrate wherein the STI cavities are defined.

18. The method of claim 11, wherein the respective STI recesses are formed to a depth of between about 400–500 angstroms.

19. The method of claim 18, wherein the effective transistor width is increased by at least one of between about 20 percent to about 100 percent and between about 600 angstroms to about 1200 angstroms.

20. The method of claim 19, wherein SRAM incorporating the transistor has a subthreshold slope of between about 65 milli-volts per decade to about 75 milli-volts per decade.

21. The method of claim 11, wherein the transistor is an NMOS transistor.

* * * * *